United States Patent
Campagna

(10) Patent No.: US 9,995,806 B2
(45) Date of Patent: Jun. 12, 2018

(54) AUTOMATED DETERMINATION OF THE RESONANCE FREQUENCIES OF PROTONS FOR MAGNETIC RESONANCE EXAMINATIONS

(71) Applicant: Siemens Aktiengesellschaft, Munich (DE)

(72) Inventor: Swen Campagna, Engelthal (DE)

(73) Assignee: Siemens Aktiengesellschaft, Munich (DE)

( * ) Notice: Subject to any disclaimer, the term of this patent is extended or adjusted under 35 U.S.C. 154(b) by 634 days.

(21) Appl. No.: 14/620,582

(22) Filed: Feb. 12, 2015

(65) Prior Publication Data

US 2016/0238683 A1 Aug. 18, 2016

(51) Int. Cl.
 *G01R 33/54* (2006.01)
 *G01R 33/46* (2006.01)
 G01R 33/48 (2006.01)

(52) U.S. Cl.
 CPC ...... *G01R 33/4625* (2013.01); *G01R 33/4828* (2013.01)

(58) Field of Classification Search
 CPC ............ G01R 33/4625; G01R 33/4828; G01R 33/483; G01R 33/485; G01R 33/5608; G01R 33/54
 See application file for complete search history.

(56) References Cited

U.S. PATENT DOCUMENTS

| 5,572,125 | A | * | 11/1996 | Dunkel | G01R 33/3875 324/307 |
|---|---|---|---|---|---|
| 5,912,558 | A | | 6/1999 | Halamek et al. | |
| 2004/0142496 | A1 | * | 7/2004 | Nicholson | A61B 5/055 436/536 |
| 2006/0273797 | A1 | * | 12/2006 | Fiorito | G01R 33/4625 324/318 |
| 2016/0131603 | A1 | * | 5/2016 | Van Der Mei | G01N 24/08 324/309 |

OTHER PUBLICATIONS

Wright et al., "A phase and frequency alignment protocol for 1H MRSI data of the prostate," NMR Biomed., vol. 25, pp. 755-765 (2012).
MacKinnon et al., "Variable Reference Alignment: An Improved Peak Alignment Protocol for NMR Spectral Data with Large Intersample Variation," Analytical Chemistry, vol. 84 (2012), pp. 5372-5379.

(Continued)

*Primary Examiner* — Rishi Patel
(74) *Attorney, Agent, or Firm* — Schiff Hardin LLP

(57) ABSTRACT

In a method and a magnetic resonance (MR) system for automated determination of the resonance frequency of a nucleus for magnetic resonance examinations, at least one MR signal is detected, and is Fourier-transformed into a spectrum composed of elements that can be represented as a vector. An analysis of the spectrum is conducted, wherein at least two cross-correlation coefficients of at least one model spectrum are determined by use of the measured spectrum. Prior to the analysis, a spectrum matrix having at least two vectors is determined from the spectrum, with each vector of the spectrum matrix being formed using all or some of the spectrum.

15 Claims, 9 Drawing Sheets

(56) References Cited

OTHER PUBLICATIONS

Savorani et al., "Icoshift: A versatile tool for the rapid alignment of 1D NMR spectra," Journal of Magnetic Resonance, vol. 202 (2010), pp. 190-202.
Wong et al., "Application of Fast Fourier Transform Cross-Correlation for the Alignment of Large Chromatographic and Spectral Datasets," Analytical Chemistry, vol. 77 (2005), pp. 5655-5661.
Vu et al., "Getting Your Peaks in Line: A Review of Alignment Methods for NMR Spectral Data," Metabolites, vol. 3 (2013), pp. 259-276.

* cited by examiner

FIG 2
(Prior art)
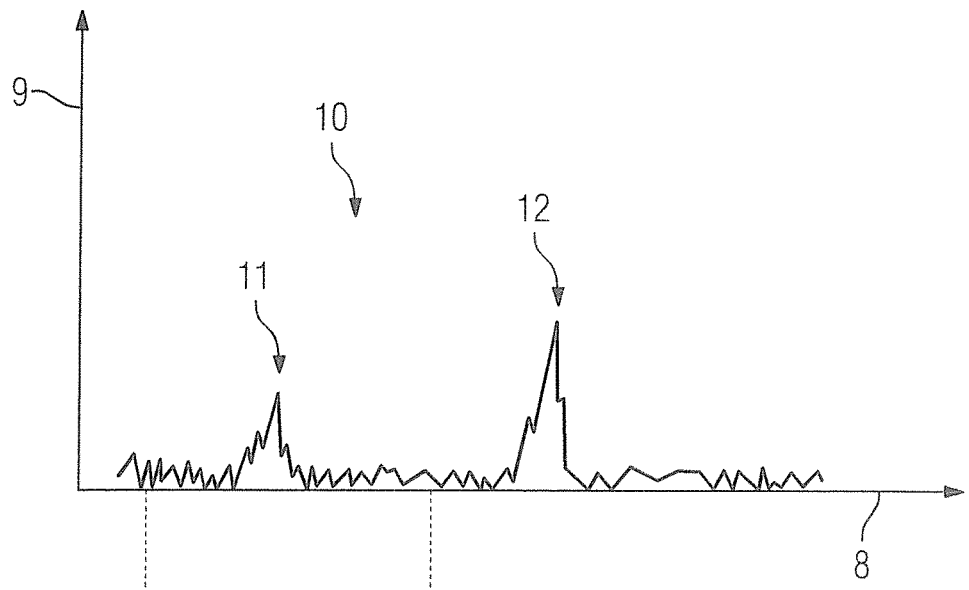
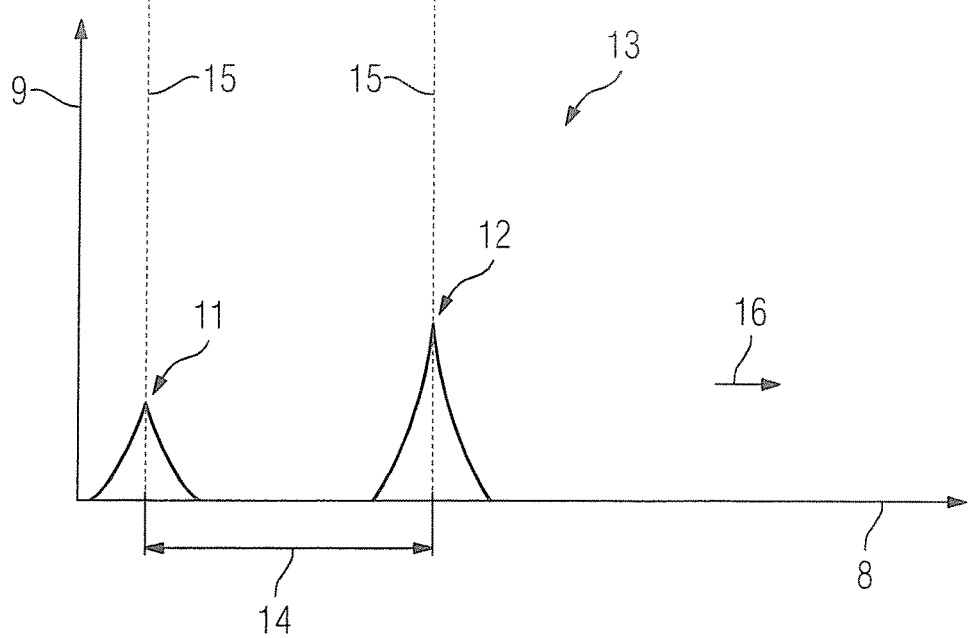

FIG 3
(Prior art)
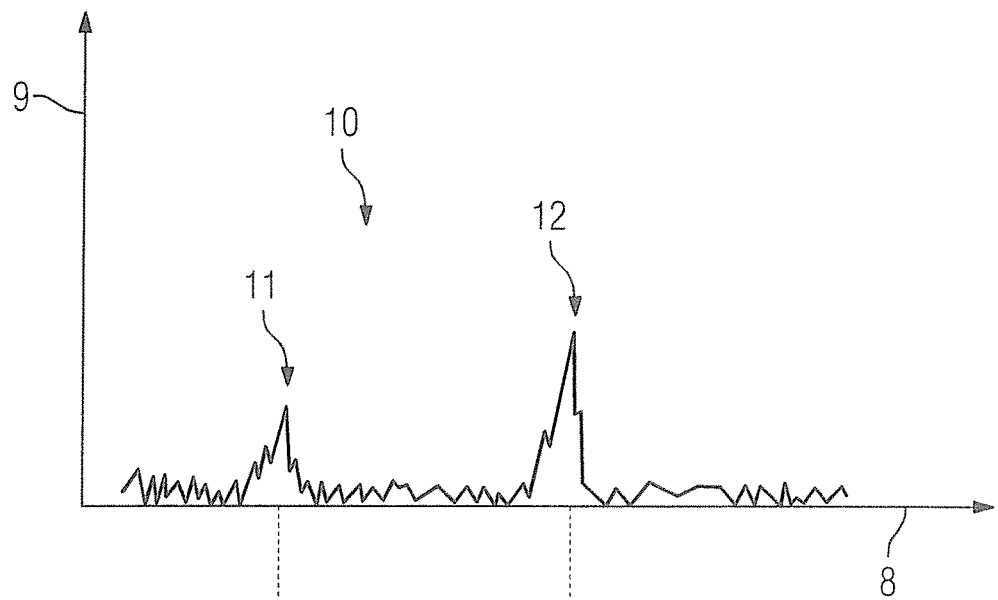
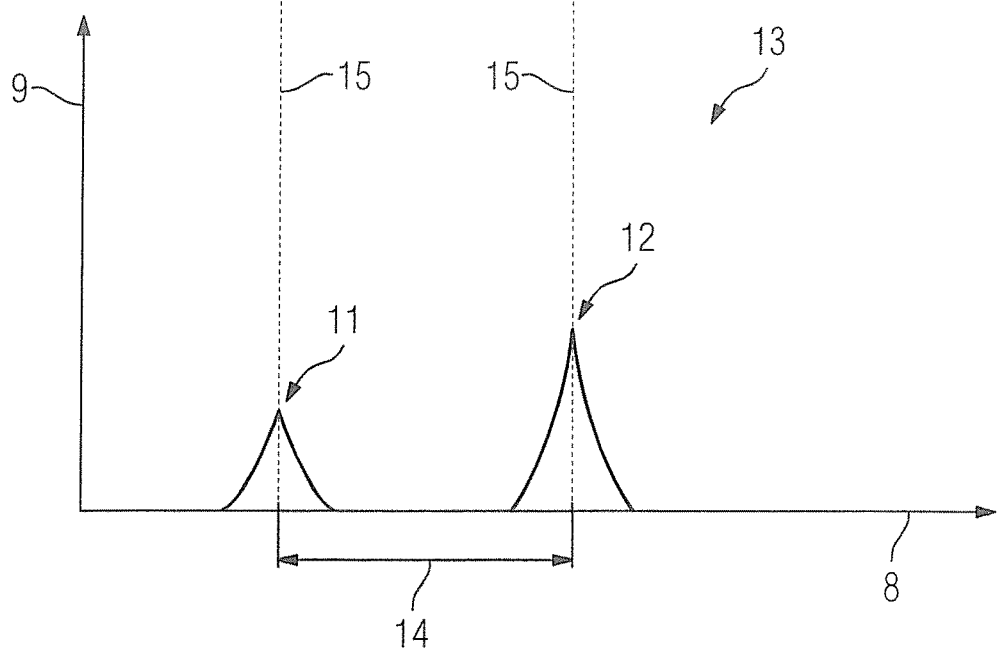

AUTOMATED DETERMINATION OF THE RESONANCE FREQUENCIES OF PROTONS FOR MAGNETIC RESONANCE EXAMINATIONS

BACKGROUND OF THE INVENTION

Field of the Invention

The present invention concerns a method for automated determination of the resonance frequencies for protons for magnetic resonance examinations, as well as a magnetic resonance apparatus that is designed to implement such a method.

Description of the Prior Art

The resonance frequency of a magnetically resonant nucleus is obtained from the so-called Larmor equation, which describes the dependence of the resonance frequency as a function of the field strength and the gyromagnetic ratio, a nucleus-specific variable. For protons, the resonance frequency lies at a field strength of 1.5 T at 63.5 MHz.

The phenomenon called chemical shift should be taken into account in addition. This describes deviations of the resonance frequency for spin species of a nucleus, this being dependent on the chemical environment of the nucleus. Thus, the resonance frequency of protons varies according to whether they are bound in fat, silicone or water. At 1.5 T, the difference between fat and water lies at 3.5 ppm, or 225 Hz.

The resonance frequency also varies for a single spin species, e.g. water protons, from examination to examination. This means that calibration measurements must be carried out when the examination subject changes or there is a change in the position of the examination subject, in order to enable an optimally automated data acquisition.

After the examination subject, a patient for example, has been introduced, the magnetic field can be homogenized. This process is also referred to as "shimming". This entails adjusting the currents in components known as shim coils so that a maximally homogeneous magnetic field is produced and as a result the decay times T2 and T2* are maximized. This process can be automated.

Furthermore, the resonance frequency can also be determined automatically. To that end, an FID is recorded and Fourier-transformed, after which it is present as a spectrum. This spectrum consists of individual elements in the form of numeric values, which accordingly represent a vector.

In this spectrum, each spin species essentially has one peak. The spin species attributed to the fat category due to the chemical factors in fact possess a number of peaks, but of these one is dominant. When reference is made in the following to "a" fat peak or resonance signal, this does not preclude the presence of further peaks. It simply means that only one peak is relevant insofar as the method according to the invention is concerned.

In order to record the FID, a frequency that corresponds e.g. to the last-used resonance frequency of the corresponding nucleus is used as the resonance frequency. The resonance frequency corresponding to the resonance frequency of the nucleus or of its main component may also be used. In the case of protons, this is the water resonance.

The spectrum can have different resonance peaks depending on the examination subject and the examination region. Peaks may be present for water alone, for water and fat, or for water and silicone, or also for all three nucleus species.

In order to determine the correct resonance frequency or correct resonance frequencies from the measured spectrum, it is furthermore known to have recourse to model spectra having one or two peaks with different signal intensities and also varying distances between the peaks, in order to determine cross-correlation coefficients by means of the measured spectrum. The more model spectra that are used, the better will be the result of the cross-correlation analysis.

The model spectra are also present in vector form, which means that the calculation of the cross-correlation coefficients is a vector operation that is repeated multiple times.

This approach has the disadvantage that it is intensive in terms of computing time and consequently it is necessary for a compromise between the time needing to be invested and the requisite quality.

SUMMARY OF THE INVENTION

An object of the present invention is to provide a less computationally intensive method for determining the resonance frequency or the resonance frequencies of a nucleus.

The basis of the invention is that, instead of a vector operation, a vector-matrix multiplication is used for determining the resonance frequencies, whereby the elements of the measured spectrum are transformed into a matrix representation. "Element" in the present context means the usual designation for a component or an entry of a matrix or a vector. The elements are therefore real or complex numbers. In this case it is necessary to modify and adapt the spectrum. Since the spectrum is to be used for an analysis by means of cross-correlation, the displacement of the spectrum with respect to a model spectrum, which happens during a determination of cross-correlation coefficients, is incorporated into the spectrum matrix by supplementing the elements of the spectrum matrix. This supplementing is not carried out arbitrarily, but rather a predefined or determinable number of elements are added, said elements all having the same numeric value, in particular zero. As a result the number of elements of a vector is increased such that the spectrum always starts with a different start element and no start position is repeated. Because the spectrum itself or, as the case may be, the vector representing the spectrum remains the same upon being inserted into the respective vectors, in other words in particular no elements are inserted within the spectrum, the repetition of a start position of the spectrum is equivalent to a repetition of a vector of the spectrum matrix. This reduces the rank of a matrix, i.e. yields no beneficial information. As this leads to unnecessary computing times, a repetition of vectors is avoided.

The number a of vectors of the spectrum matrix can be derived from the number b of the added elements:

$$a = b + 1.$$

Each model spectrum that is present as a vector is multiplied with the thus obtained spectrum matrix. The length of a vector of a model spectrum, or, to put it another way, the number of its elements, can be relatively arbitrarily adjusted in this case, except for a minimum length on account of the central region containing the signal peaks.

As a result of the conditioning of the spectrum and the vector-matrix multiplication made possible thereby, the cache of the main memory of a control device can be used more efficiently, thereby reducing the memory access frequency and consequently shortening the computing time.

A row vector or a column vector of the spectrum matrix can advantageously be formed as a vector. It is not important whether the spectrum is processed further on a column-by-column or row-by-row basis. In particular, the spectrum can be transposed from one form into the other. It is, however, necessary to keep to the form once this has been selected.

Preferably, the number of elements of a vector can be determined as a function of the number of elements of the spectrum and as a function of the displacement steps in the shifting of the spectrum. In this case the number e of added elements of a vector corresponds to the number b of displacement steps. Thus, $e=b.$ If the length f of the measured spectrum is added after all of the post-processing steps, the length l of a vector is $l=e+f=b+f.$ The spectrum matrix accordingly has the dimension a×l.

Advantageously, the first elements in the first vector can be occupied by the added elements, in particular values equal to zero, and the remaining elements by the elements of the spectrum.

The first vector has the added elements, e.g. ten elements, at the start, the spectrum completing the first vector of the spectrum matrix. The second vector has one less of the added elements, that is to say e.g. nine elements, at the start, then follows the spectrum, and at the end is one of the added elements.

In this way the measured spectrum or, as the case may be, the vector representing the measured spectrum, "slips" during the formation of the vectors of the spectrum matrix element by element through the added elements until the spectrum stands right at the start and the added elements are disposed at the end.

The model spectra can be combined particularly advantageously into a model spectra matrix by forming a vector of the model spectra matrix from each model spectrum. If the model spectra do not have the same length, they must be adjusted to fit, in particular by elements having numeric values equal to zero being added at the start and/or end. The model spectra can be represented as column or row vectors. A vector of the model spectra matrix is therefore transposed in comparison with a vector of the spectrum matrix. If the vectors of the spectrum matrix are row vectors, the vectors of the model spectra matrix are column vectors, and vice versa. In a matrix-matrix multiplication, the advantageous use of the CPU cache is realized twice.

Preferably, the spectrum matrix and the model spectra matrix can be partitioned into submatrices and processed one block at a time. This approach, known as blocking, enables a further reduction in the number of accesses to the main memory, since the blocks or submatrices can be held available in the faster level-1 or level-2 caches.

Advantageously, the submatrices can be formed as a function of the size of at least one CPU cache that is used for performing the method. As the advantages of the blocking strategy yield the greatest benefits when an access to the main memory is avoided and the CPU cache or caches is or are utilized to maximum effect, the size of the submatrices should be aligned thereto so that the CPU caches are optimally used. It is not possible to designate universally valid specifications, because the described quantities, such as the number of displacement steps, length of the spectrum or even the size of a cache, are extremely variable and therefore no values can be predefined.

The object underlying the present invention is also achieved by a magnetic resonance system, which has at least one radiofrequency coil for generating radiofrequency pulses, and a control device. The control device is designed (configured) to operate the magnetic resonance system so as to perform the method as described above.

The aforementioned methods can in this case be implemented in the control device in the form of software or as (hardwired) hardware.

BRIEF DESCRIPTION OF THE DRAWINGS

FIG. 2 shows a spectrum and a model spectrum in a first embodiment (prior art).

FIG. 3 shows a spectrum and a model spectrum in a second embodiment (prior art).

DESCRIPTION OF THE PREFERRED EMBODIMENTS

Figure 1:
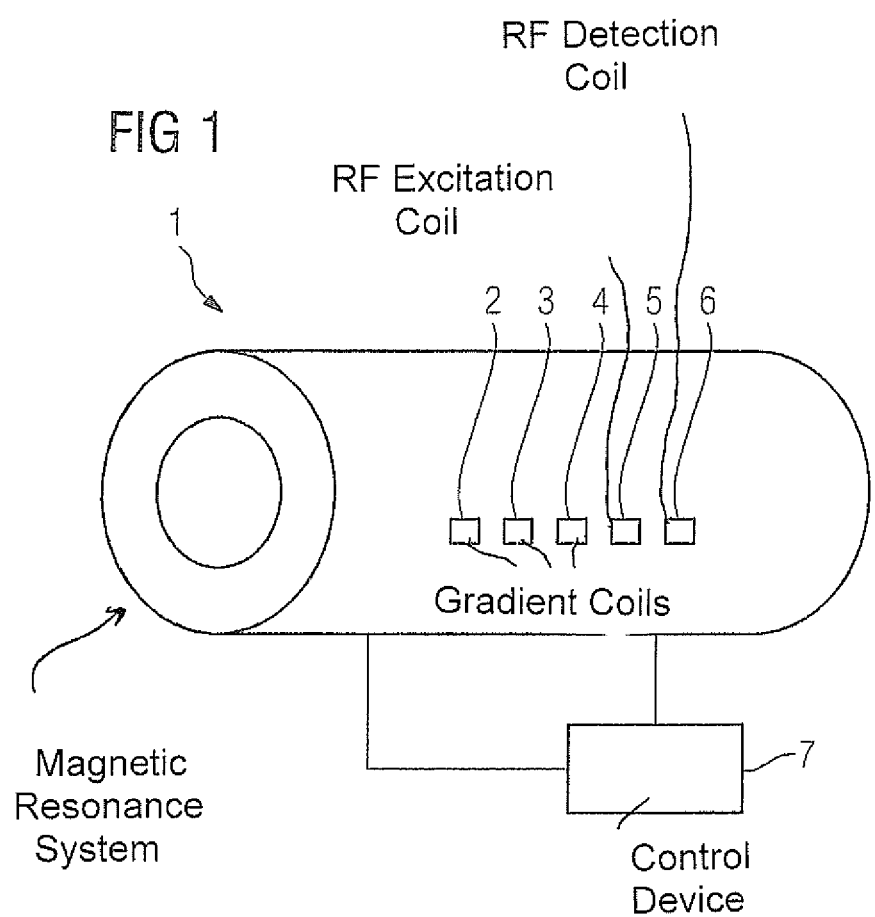
FIG. 1 schematically illustrates a magnetic resonance system.

FIG. 1 shows a magnetic resonance system 1 having three gradient coils 2, 3 and 4, two radiofrequency coils 5 and 6, and a control device 7. For clarity of illustration, other components of the magnetic resonance system 1, such as the patient table, are not shown. In this example the radiofrequency coil 5 is embodied as an excitation coil, and the radiofrequency coil 6 as a detection coil. The radiofrequency coil 6 is in this case usually tailored to fit specific sections of the examination subject, for example as a "head coil", "chest coil" or "knee coil". The radiofrequency coil 5 is also called a "body coil" and is less sensitive than the radiofrequency coil 6, but homogeneous over a greater area. This subdivision of the radiofrequency coils is typical in the case of magnetic resonance systems 1 in the medical field, but not in the case of devices having bores in the range of several centimeters or up to approx. 30 centimeters, where the same radiofrequency coil is often used for both excitation and detection. Whether the excitation coil is simultaneously the detection coil is therefore immaterial and more or less device-dependent.

The method described is implemented as software in the control device 7. Following the positioning of the patient, it is performed as part of the calibration process prior to the commencement of the examination measurements. The adjustment of the shim coils is also performed in an automated manner.

FIGS. 2 and 3 show the procedure adopted in the case of a calculation of cross-correlation coefficients according to the prior art. Here, the axis 8 is in each case a measure for the frequency, and the axis 9 is a measure for the signal intensity. Whether the measured signal 10 that was calculated from an FID includes a fat peak 11 and a water peak 12, or only a water peak 12, or also additionally has a silicone peak, is not known without supplementary information. The position and the distance between the peaks, in particular the fat peak 11 and the water peak 12, are variable also. The model spectrum 13 shown in FIG. 2 contains a fat peak 11 and a water peak 12 having predefined signal intensities and peak-to-peak distances 14. One model spectrum differs from another model spectrum by the height of the signal intensities and/or peak-to-peak distances and/or the number of peaks and/or the peak width. The peak width may be defined as the width at half maximum height, also called full width half maximum or FWHM.

FIG. 2 shows the determination of a coefficient, wherein the reference lines 15 indicate that the correspondence of the peaks and consequently the numeric value of the coefficient are small. Further coefficients are determined by shifting the model spectrum 13 with respect to the measured spectrum 10 in the direction of the arrow 16. Since both the measured spectrum 10 and the model spectrum 13 are present as vectors containing elements, the shift can take place one element at a time or in leaps, i.e. in steps of multiple elements.

After one or more shifts, the analysis reaches a relative position of the spectra 10 and 13 as shown in FIG. 3. The model spectrum 13 has substantially the right number of peaks, signal intensities, peak widths, and peak-to-peak distances. Thus, the value of the cross-correlation coefficient of the cross-correlation calculation determined according to FIG. 3 is at a maximum and indicates a good or optimal correspondence between model spectrum 13 and measured spectrum 10. All other determined coefficients are lower and therefore "worse", i.e. the respective numeric value indicates a poorer correspondence. The resonance frequency of water and fat can then be derived from this information. It has also become known that no silicone peak is present, since model spectra containing a silicone peak generate correlation coefficients having a lower value.

Figure 4:
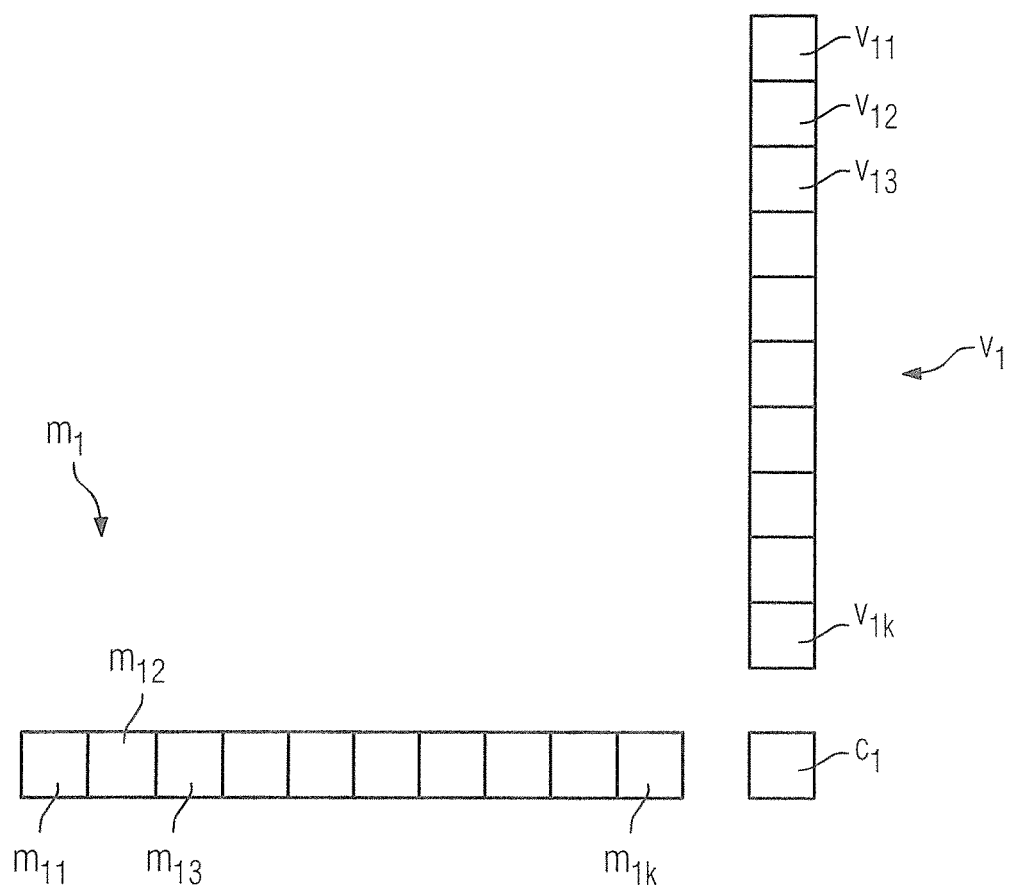
FIG. 4 shows a spectrum and a model spectrum in vector form (prior art).

This vector-vector calculation is illustrated schematically once more in FIG. 4, where the measured spectrum 10 or a segment thereof is represented as vector $v_1$, and the model spectrum 13 as vector $m_1$. The index "1" of the vector $m_1$ indicates that more than one model spectrum is used. In the case of the vector v, in contrast, the segment is indexed therewith. The representation of the vector $v_1$ as a column vector and the representation of the vector $m_1$ as a row vector are interchangeable. To ensure the vectors $v_1$ and $m_1$ each have the same length, a part or segment of the measured spectrum is "cut out" in each case, said segment being equal in length to the length of the model spectrum. The elements $m_{11}, m_{12}, m_{13}, \ldots, m_{1k}$ are the elements of the vector $m_1$, where "k" stands for an arbitrary natural number. The elements $v_{11}, v_{12}, v_{13}, \ldots, v_{1k}$ are the elements of the vector $v_1$.

Figure 5:
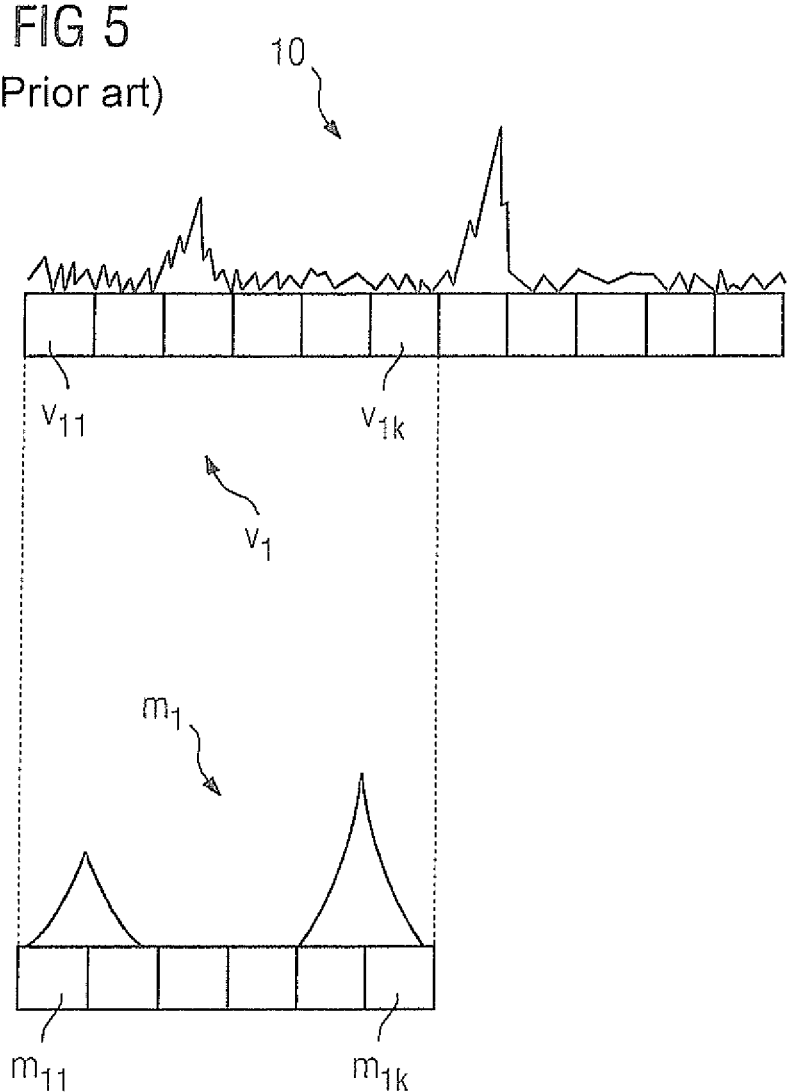
FIG. 5 illustrates cross-correlation of the spectrum and model spectrum of FIG. 4 (prior art).

This is shown purely illustratively in FIG. 5, where the index "1" of the vector $v_1$ points to the position of the segment in the measured spectrum 10 and the index "1" of the vector $m_1$ points to the model spectrum used. A correlation coefficient $c_j$ is determined for each combination of segments $v_i$ and model spectra $m_n$. The highest correlation coefficient $c_j$ indicates the best fit. The indices "i", "j" and "n" are also arbitrary natural numbers.

Figure 6:
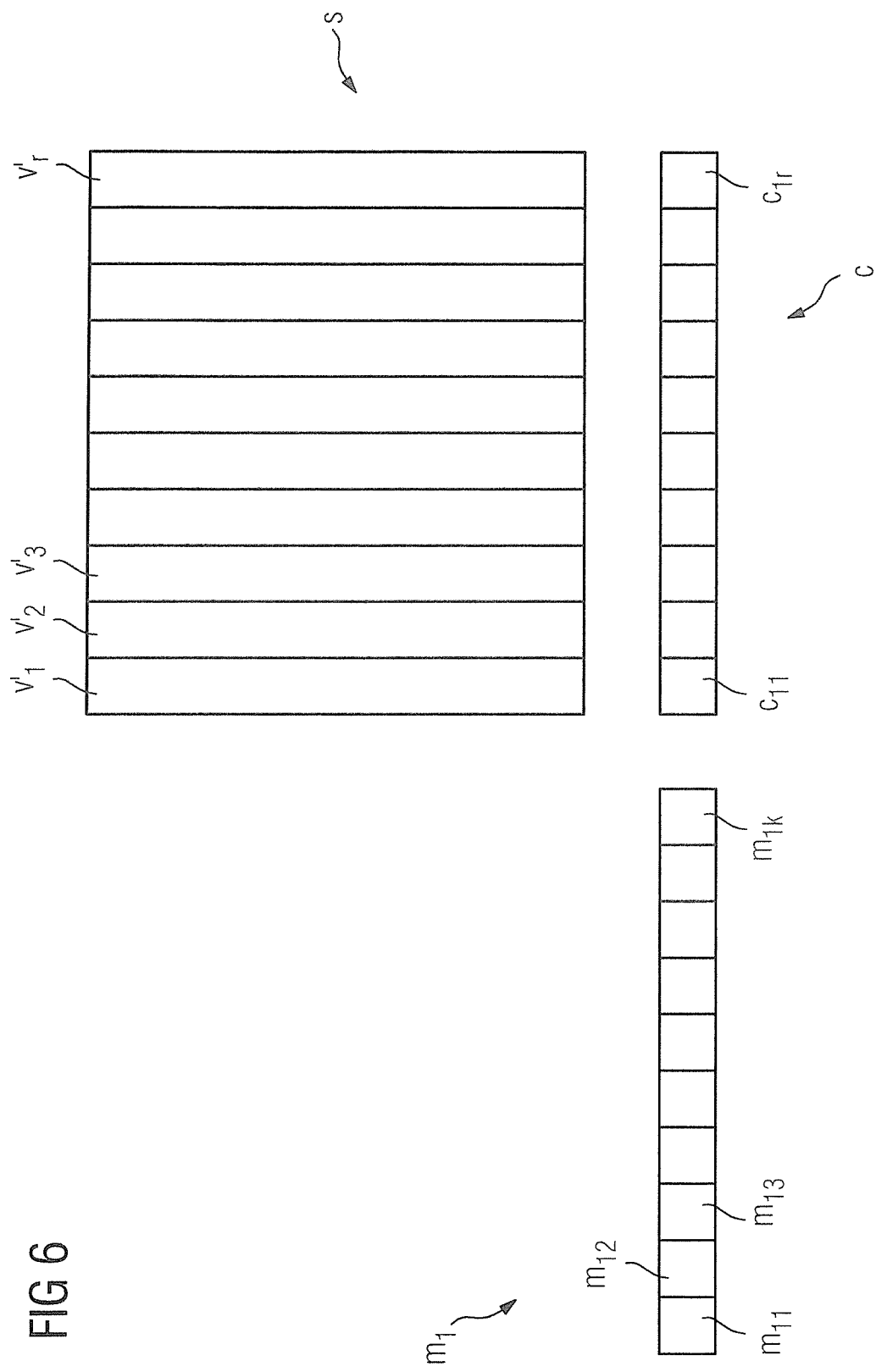
FIG. 6 shows a spectrum matrix and a model spectrum, for use in accordance with the invention.

Although this approach yields high-quality results in the determination of the resonance frequencies, it is nonetheless computationally intensive. More efficient methods are revealed hereinbelow:

Instead of the spectrum vector v, a spectrum matrix s is used which is formed from a segment $v_i$ of the spectrum vector v and hence a part of the spectrum vector v or the whole spectrum vector v, as is apparent from FIG. 6. The spectrum matrix s is therefore built from vectors $v'_i$. In order to form a vector $v'_i$ of the spectrum matrix s, the spectrum vector v or a part thereof, namely a segment $v_i$, is taken and supplemented with elements 16. The elements 16 are numbers with a predefined value, in particular 0 for the first vectors $v'_1$ and the last vectors $v'_r$. In the case of the vectors therebetween, pure measured data are used. In particular, a total vector supplemented by the elements 16 can be formed and the columns $v'_1, v'_2 \ldots v'_r$ as pointers to parts of the total vector.

Figure 7:
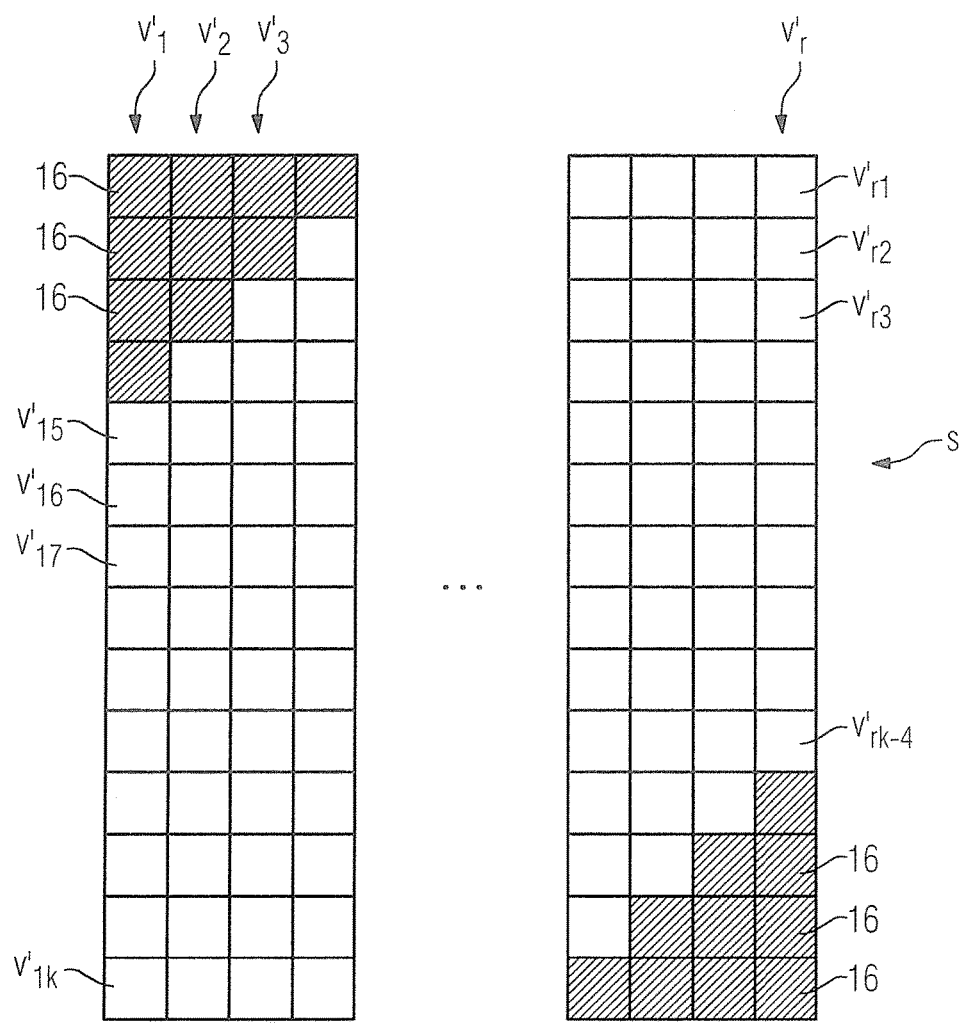
FIG. 7 shows a spectrum matrix, for use in accordance with the invention.
Figure 8:
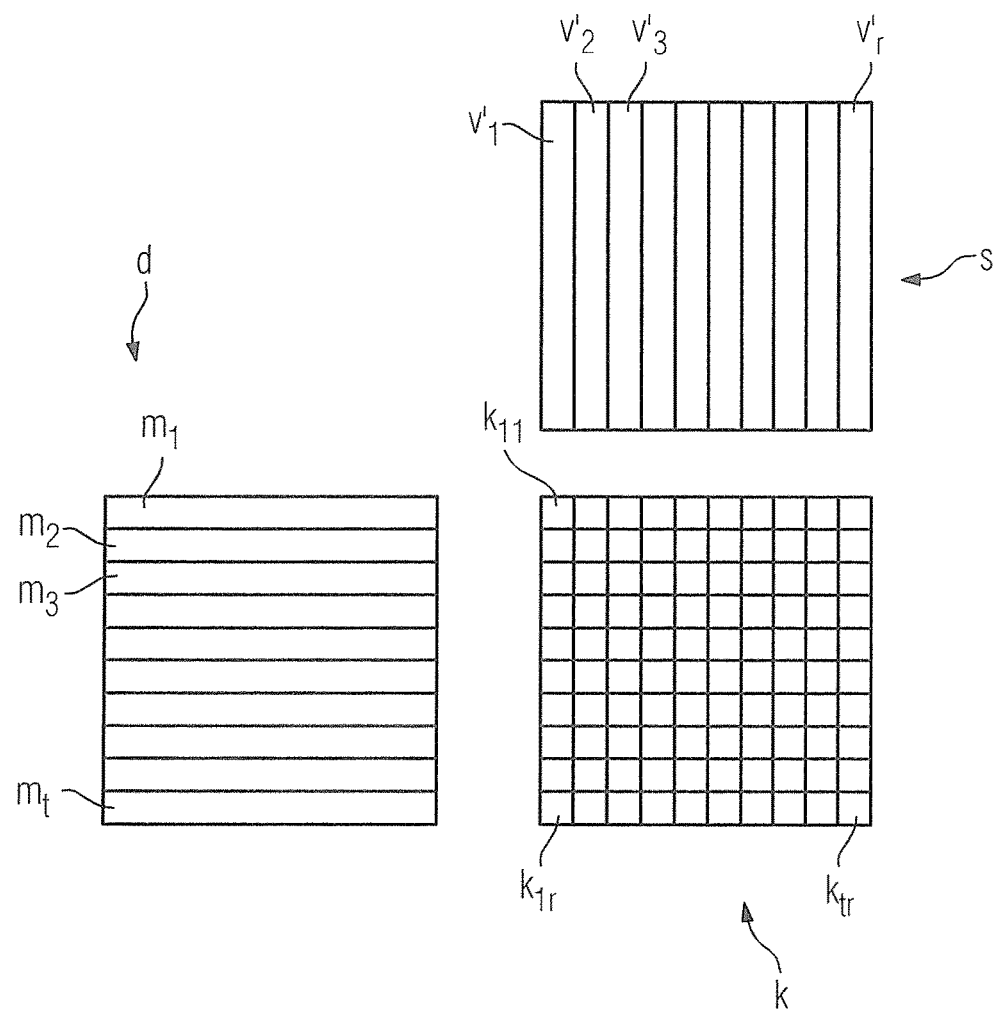
FIG. 8 shows a spectrum matrix and a model spectra matrix, for use in accordance with the invention.

In FIG. 7, the elements 16 are highlighted by black shading, thereby making the element-by-element slipping of the vector v or of a segment $v_i$ due to the added elements 16 clear at a glance.

The coefficient vector c is obtained as the result of the vector-matrix multiplication $m_1 \times s$. The element $c_j$ of the coefficient vector c having the highest value indicates that vector $v'_i$ for which the model spectrum $m_1$ shows the best fit.

Due to the transformation of the calculation of the correlation coefficients by means of a matrix, these can be determined with lower computational overhead.

To achieve a further optimization, the model spectra $m_n$ can also be transformed into a model spectra matrix d. Each model spectrum $m_n$ is included once, the shifts with respect to the measured spectrum being contained in the spectrum matrix s. The matrix-matrix multiplication $d \circ s$ yields a correlation coefficient matrix k. Once again it holds that: The element $k_{jn}$, now the coefficient matrix k, having the highest value indicates that vector $v'_i$ and that model spectrum $m_n$ for which the best fit is present.

Figure 9:
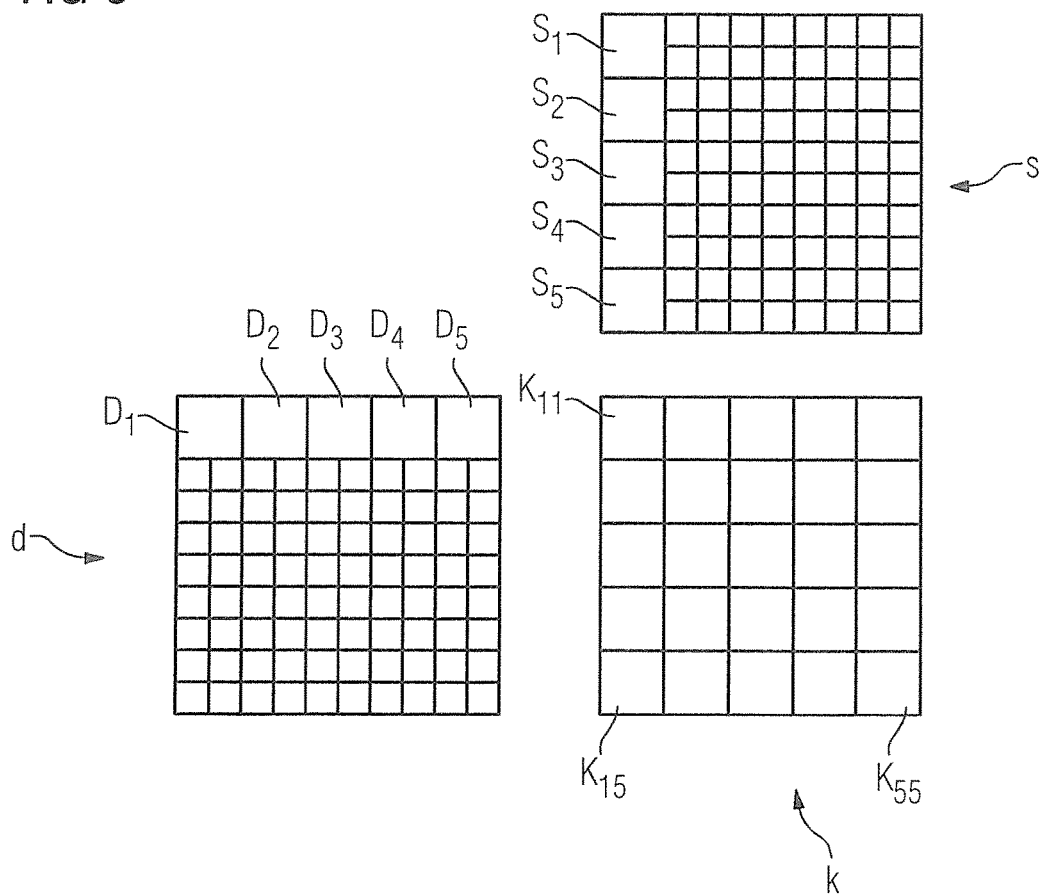
FIG. 9 shows a spectrum matrix and a model spectra matrix containing submatrices for use in accordance with the invention.

A further improvement in computing time is produced by partitioning the matrices s and d into submatrices, as shown in FIG. 9. This approach is also called blocking. Although the number of compute operations cannot actually be decreased by this means, the number of memory accesses can be reduced. The number of accesses, and consequently also the computing time, can be minimized by suitable choice of the size of the submatrices $S_i$, in particular of the submatrices $S_1, S_2, S_3, S_4$, and $S_5$, and of the submatrices $D_i$, in particular of the submatrices $D_1, D_2, D_3, D_4$ and $D_5$, and at the same time alignment to the size of a cache, in particular the level-1 cache, the level-2 cache or the level-3 cache.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for automated determination of a resonance frequency of an atomic nucleus for magnetic resonance examinations, comprising:

with a computer, operating a magnetic resonance data acquisition apparatus to acquire at least one magnetic resonance signal from a subject;

in said computer, Fourier-transforming said at least one signal into a measured spectrum comprised of elements that can be represented as a vector;

in said computer, generating a spectrum matrix comprising at least two vectors determined from said measured spectrum, each of said at least two vectors being formed using at least a portion of said measured spectrum;

in said computer, automatically cross-correlating said spectrum matrix, with a model spectrum represented as a vector, said model spectrum comprising at least one spectral peak at a modeled position in said model spectrum for a known atomic nucleus, in order to identify a peak in said measured spectrum that has a highest correlation coefficient in said cross-correlation;

in said computer, identifying a frequency in said measured spectrum of the identified peak in said measured spectrum;

with said computer, operating said magnetic resonance data acquisition apparatus at a resonance frequency corresponding to the identified frequency in said measured spectrum, in order to acquire diagnostic magnetic resonance data from the subject; and in said computer, transforming said diagnostic magnetic resonance data into image data of the subject, and making the image data available from the computer in electronic form, as a data file.

2. A method as claimed in claim 1 comprising, in said computer, shifting a position of said measured spectrum, or portions of the measured spectrum, in said at least two vectors of the spectrum matrix with respect to each other in order to produce said spectrum matrix.

3. A method as claimed in claim 2 comprising, in said computer, determining a number of the elements in each of said at least two vectors of said spectrum matrix as a function of a number of elements of said measured spectrum and as a function of displacement steps in said shifting of said spectrum.

4. A method as claimed in claim 1 comprising always using an entirety of said measured spectrum, or always using a same part of said measured spectrum, for forming said at least two vectors of said spectrum matrix.

5. A method as claimed in claim 1 comprising forming said at least two vectors of said spectrum matrix by adding elements having a predetermined numerical value to said measured spectrum or a portion thereof.

6. A method as claimed in claim 5 wherein said numerical value is zero.

7. A method as claimed in claim 5 comprising forming a first of said at least two vectors by first elements occupied by the added elements and by remaining elements that are occupied by elements of the measured spectrum, and forming subsequent vectors of said at least two vectors after said first vectors by shifting said measured spectrum or a portion of said measured spectrum by one element with respect to a first element in said first vector.

8. A method as claimed in claim 1 comprising using different or only partially identical portions of said measured spectrum for forming said at least two vectors of said spectrum matrix.

9. A method as claimed in claim 1 comprising forming spectrum matrix with said at least two vectors as rows or columns of said spectrum matrix.

10. A method as claimed in claim 1 comprising generating a model spectrum matrix in said computer by combining model spectra so as to each be a vector of said model spectrum matrix.

11. A method as claimed in claim 10 comprising forming each vector of said model spectrum matrix respectively from each model spectrum of said model spectra.

12. A method as claimed in claim 10 comprising partitioning said spectrum matrix and said model spectrum matrix into sub-matrices, and performing said cross-correlation with pairs of said spectrum matrix, sub-matrices and said model spectrum sub-matrices, one pair at a time, in said computer.

13. A method as claimed in claim 12 comprising forming each of said sub-matrices as a function of a size of at least one cache of said computer.

14. A method as claimed in claim 1 comprising operating said magnetic resonance data acquisition apparatus to acquire an FID signal as said at least one magnetic resonance signal.

15. A magnetic resonance apparatus comprising:

a magnetic resonance data acquisition unit;

a computer configured to operate said magnetic resonance data acquisition apparatus to acquire at least one magnetic resonance signal from a subject;

said computer being configured to Fourier-transform said at least one signal into a measured spectrum comprised of elements that can be represented as a vector;

said computer being configured to generate a spectrum matrix comprising at least two vectors determined from said measured spectrum, each of said at least two vectors being formed using at least a portion of said measured spectrum;

said computer being configured to automatically cross-correlate said spectrum matrix, with a model spectrum represented as a vector, said model spectrum comprising at least one spectral peak at a modeled position in said model spectrum for a known atomic nucleus, in order to identify a peak in said measured spectrum that has a highest correlation coefficient in said cross-correlation;

said computer being configured to identify a frequency in said measured spectrum of the identified peak in said measured spectrum;

said computer being configured to operate said magnetic resonance data acquisition apparatus at a resonance frequency corresponding to the identified frequency in said measured spectrum, in order to acquire diagnostic magnetic resonance data from the subject; and said computer being configured to transform said diagnostic magnetic resonance data into image data of the subject, and to make the image data available from the computer in electronic form, as a data file.

* * * * *